United States Patent [19]

Maas

[11] 4,331,727
[45] May 25, 1982

[54] ADHESIVE TRANSFER DEVICE

[76] Inventor: Stanley Maas, 366 Main St., Port Washington, N.Y. 11050

[21] Appl. No.: 840,486

[22] Filed: Oct. 7, 1977

Related U.S. Application Data

[63] Continuation-in-part of Ser. No. 614,172, Sep. 17, 1975, abandoned.

[51] Int. Cl.³ .................... B29D 7/26; B32B 7/02; B32B 7/06; C09J 7/02
[52] U.S. Cl. .................... 428/213; 427/177; 427/179; 427/209; 428/42; 428/266; 428/352; 428/354; 428/452; 428/914
[58] Field of Search ............... 96/83, 75; 428/212, 428/352, 40, 213, 246, 261, 262, 264, 265, 266, 354, 452, 914, 42; 427/208, 207 B, 177, 179, 209; 40/2 R

[56] References Cited

U.S. PATENT DOCUMENTS

| | | | |
|---|---|---|---|
| 2,528,395 | 10/1950 | Slifkin | 96/75 |
| 2,607,711 | 8/1952 | Hendricks | 427/208 X |
| 2,914,167 | 11/1959 | Holtz | 427/208 X |
| 3,359,107 | 12/1967 | Goffe et al. | 96/83 |
| 3,394,799 | 7/1968 | Ritson et al. | 427/208 X |
| 3,509,991 | 5/1970 | Hurst | 428/352 |
| 3,671,236 | 6/1972 | Beusekom | 96/75 X |
| 3,928,690 | 12/1975 | Settineri et al. | 427/208 X |

Primary Examiner—Thomas J. Herbert, Jr.
Attorney, Agent, or Firm—Lewis H. Eslinger

[57] ABSTRACT

An adhesive transfer device is disclosed for use in preparing mock-ups of newspaper pages, advertising and the like, by supplying adhesive to the back of the material to be secured to the mock-up. The device includes a substrate carrier having a pair of opposed surfaces and a layer of release coating material coated on each of these faces. An adhesive layer is placed on one of the release coating layers and the substrate is rolled into a roll. This roll is easily unrolled when it is desired to use the adhesive and the adhesive face will then be exposed so that it can be contacted with the specimen, photograph or other article to be placed on the mock-up page. After this contact, when the specimen is pulled from the substrate, the adhesive coating is released from the substrate, remains on the photo, and serves to secure the photo or the like to the mock-up sheet.

9 Claims, 6 Drawing Figures

FIG.1
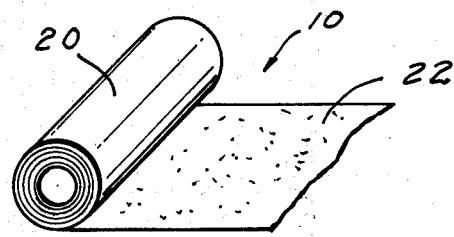
FIG.3
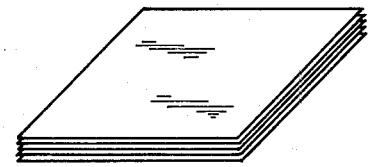
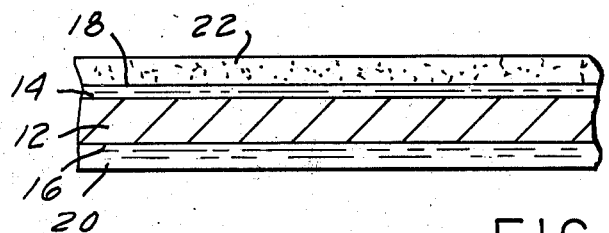
FIG.2
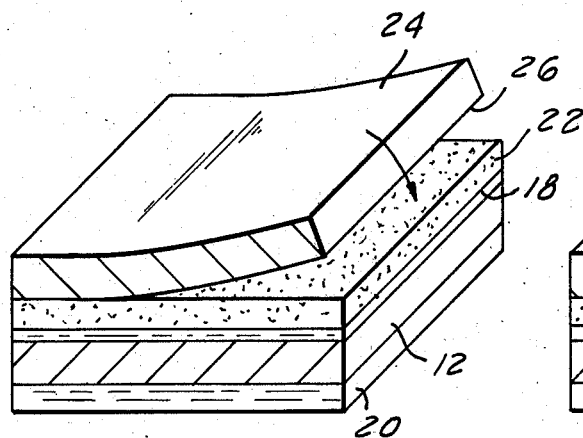
FIG.4
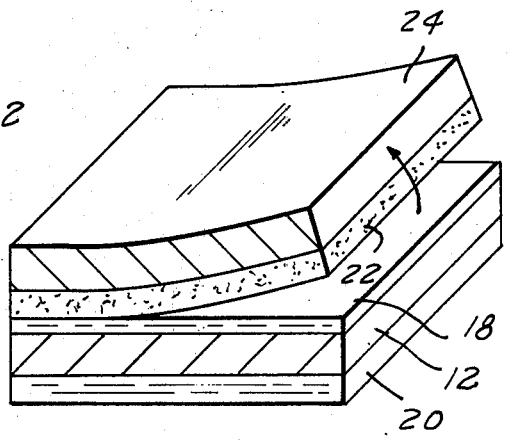
FIG.5
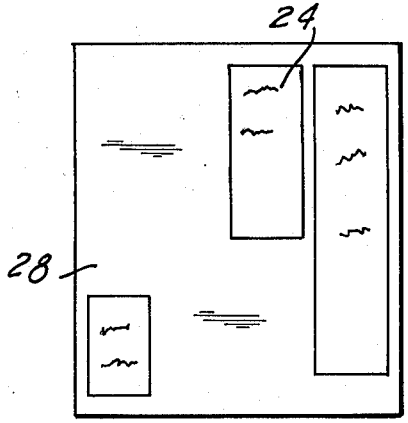
FIG.6

ADHESIVE TRANSFER DEVICE

This application is a continuation-in-part of U.S. patent application Ser. No. 614,172, filed Sept. 17, 1975 now abandoned, the disclosure of which is incorporated herein by reference.

The present invention relates to an adhesive storage and transfer device by which an adhesive layer can be applied to the back of photographs, drawings, newspaper print and the like, to permit them to be secured to mock-up sheets or the like in a relatively fast, neat and convenient manner.

In assembling newspapers, magazines and advertising literature and the like, a mock-up is initially made of an individual page to enable the persons preparing the mock-up to visualize the completed printed sheet. Typically the mock-up is made by utilizing photographic images, preprinted strips or columns, drawings or the like, which are cut or shaped to a desired size, and then pasted on the mock-up page. The specimen to be placed on the page is adhered to the mock-up page by using either rubber cement or another type of adhesive which is manually applied to its back surface. The specimen is then pressed against the mock-up page in the desired location. Of course it will be appreciated that this procedure is relatively inconvenient and difficult, and also causes damage to the remainder of the mock-up page because of spillage or smearing of the adhesive. This then reduces the quality of the mock-up page, which may later have to be reproduced to create a master photographic image. Moreover, the multiple manual operations necessary to placing the adhesive on the back of the specimen and then secure it to the mock-up page are relatively time-consuming; and, when a large magazine or newspaper is being assembled, require a material additional amount of time in the production process.

In accordance with the present invention a device or article of manufacture is provided which is adapted to transfer an adhesive from a carrier sheet to the document or specimen to be placed on the mock-up page, in a relatively simple manner, and without the mess attendant to the application of rubber cement adhesives or the like heretofore used in producing such mock-ups. This transfer device consists of a carrier sheet having front and rear surfaces which are coated with layers of a release material. The layer on the rear surface has a greater release value (i.e. releases more easily) than the layer on the front surface, which has a layer of pressure sensitive adhesive adhered to it. The carrier, with this construction, can be rolled up into a roll for shipment and storage, so that the layer of release material having the greater release value faces outwardly, on the exterior of the roll. By this arrangement the carrier sheet can be conveniently unrolled when it is desired to use the device, and the layer of adhesive remains adhered to the layer of release coating having the smaller release value while it releases from the other layer of the release coating during the unrolling operation. The photograph or specimen desired to be secured to the mock-up page is then placed with its rear face on the adhesive layer of the carrier sheet, and then it is stripped from the carrier sheet. Because of the release coating on which the adhesive layer is positioned, the adhesive layer adheres to the back of the specimen and is released from the release coating or layer of the carrier sheet. Thus the adhesive layer is transferred to the back of the specimen, and the specimen can then be secured to the mock-up page by the layer of adhesive. In this manner, the back of the specimen to be placed on the mock-up page is coated with an adhesive layer, but without the difficulties attendant to the use of rubber cement and other types of liquid adhesives previously used in preparing mock-up pages.

The above, and other objects, features and advantages of this invention will be apparent in the following detailed description of an illustrative embodiment thereof, which is to be read in connection with the accompanying drawings, wherein:

FIG. 1 is a perspective view of a roll of adhesive transfer sheeting, constructed in accordance with the present invention;

FIG. 2 is an enlarged sectional view of a portion of the adhesive transfer sheeting shown in FIG. 1;

FIG. 3 is a perspective view of a stack of sheets constructed in accordance with the embodiment of FIG. 2;

FIGS. 4 and 5 are perspective views showing the manner in which the adhesive layer is transferred from the carrier sheet to the specimen to be used on a mock-up page; and FIG. 6 is a plan view of a partially assembled mock-up page for use in creating a newspaper.

Referring now to the drawing in detail, and initially to FIG. 1 thereof, a roll of adhesive transfer sheeting 10 constructed in accordance with the present invention, is illustrated. The roll consists of a carrier sheet 12 having front and rear surfaces 14, 16 respectively on which layers 18, 20 respectively of a release coating material are placed. The release coating may be formed of a silicone type material and, in one embodiment, may be the type of material sold under the trademark "Syl-Off," by Dow Corning; alternatively it may be a silcone base release material sold under the designation SS-4191 by General Electric Company. Other known types of release materials may also be used. The carrier sheet 12 may be formed of paper, vinyl or plastic, or other suitable carrier material and is coated with layers of release coating 18, 20, in any known manner. However, in accordance with the present invention the layer of release coating material 18 on front side 14 of carrier sheet 12 has s smaller release value than layer 20. In one embodiment the difference in release value is achieved by using different thicknesses of the release coating material. For example, in the presently preferred embodiment the layer 18 has a thickness of 0.00025 inches while the layer 20 has a thickness of 0.0005 inches.

After substrate or carrier 12 is coated with layers 18, 20 of the release coating material, a layer of pressure sensitive adhesive material 22 is applied to the thinner release coating 18 on the front side of the carrier. This pressure sensitive adhesive may be of any known composition, and may for example consist of rubber latex, polyisobutynol, or polyvinylalcohol and other resin type adhesives, including acrylic type adhesives.

With the adhesive transfer sheet formed in this manner, the sheet may be rolled into roll 10 so that adhesive layer 22 on the release coating 18 bears against the thicker release coating 20 on the rear face of the carrier 12 (i.e. the release coating having the greater release value). By rolling the adhesive transfer carrier in this manner, higher release value coating layer 20 will be exposed in the wound up roll, and the adhesive layer will be protected within the roll itself. However, because the adhesive coating is in contact with the release coating 20, the roll can be conveniently unrolled to expose the adhesive layer 22 when it is desired to use the adhesion transfer device. This adhesive layer 22 stays on layer 18 because layer 20 has a greater release value than layer 18.

In use, the roll in unrolled to expose a sufficient area of adhesive, and is cut into a sheet. The specimen to which the adhesive is to be applied (illustrated as the specimen sheet 24 in FIGS. 4 and 5) is then placed on adhesive layer 22 with its rear surface 26 in contact with the adhesive layer. The specimen 24 is pressed down against the adhesive layer, and then peeled from that layer, as seen in FIG. 5. Because the adhesive layer is secured to the release coating 18, it has a greater adherence to the back of the specimen (which usually is a paper sheet or photographic layer) than it does to the release coating, so that it will stay on specimen 24 and be removed with it from release coating 18.

As mentioned, the release value of the release coating 18 can be varied as desired by simply varying its thickness; and preferably the layer 18 has a smaller thickness than the layer 20 so that the roll 10 can be unrolled, with the adhesive layer 22 remaining on layer 18 where it is exposed for transfer when it is engaged with a paper specimen or the like 24.

With the adhesive layer 22 now on the photograph or specimen 24, the specimen can be easily positioned and secured to a mock-up page 28, as illustrated in FIG. 6. In forming the mock-up page a number of specimens or photographs are positioned on page 28 in order to enable the preparer to obtain a visual representation of the final end product. the adhesive layer 22 is neatly secured to the back of the specimen, so that there is no smearing or running of adhesive onto or between adjacent specimens. Thus the completed mock-up page can be used as a master to produce a photographic master which in turn is used in photocopying and reproducing the mock-up page in the final product.

It is noted that although in the illustrative embodiment the carrier sheet 12 is rolled into the roll shown in FIG. 1, it is also contemplated that the sheet can be cut into uniform sheet sections, during the maufacturing process, with the sheets stacked one upon the other, again with the adhesive layer 22 positioned against the release coating 20 of an adjacent carrier sheet. This enables individual carrier sheets to be peeled and separated from one another to expose adhesive layer 22 so that it is available for transfer to the back of a specimen to be used in the mock-up page.

By this arrangement, specimens, photographs, drawings or the like can be adhered to a mock-up page, or any other surface, with a minimum of effort and in a neat and clean manner. The provision of the adhesive transfer sheet of the present invention eliminates the need for glue pots and the multiple manual steps which must be performed in order to apply a liquid glue to the back of the photograph or specimen being used to form the mock-up page. Thus the present invention achieves a substantial reduction in the time involved in assembling a mock-up page, as well as providing an improved and clean product, which would be suitable for use in reproducing a master image.

Although an illustrative embodiment of the present invention has been described herein with reference to the accompanying drawings, it is to be understood that the invention is not limited to that precise embodiment, and that various changes and modifications may be effected therein by one skilled in the art without departing from the scope or spirit of this invention.

What is claimed is:

1. An article of manufacture comprising a substrate carrier sheet having a pair of opposed faces; a layer of release coating material formed on each of said faces; one of said layers of release coating having a greater release value than the other and a releasable adhesive coating on said one of said layers of release coating; said one layer of release coating being thicker than the other layer of release coating.

2. An article as defined in claim 1 wherein said article is rolled up upon itself with said adhesive layer contacting the other of said layers of release coating.

3. An article as defined in claim 1 wherein said substrate is formed of a material selected from the group consisting of paper, vinyl and/or plastic.

4. An article as defined in claim 3 wherein said release coatings are formed of silicone.

5. An article as defined in claim 4 wherein said adhesive is a pressure sensitive adhesive.

6. An adhesive transfer device comprising a carrier sheet having front and rear faces, a layer of release coating material positioned on each of said faces with the layer on said front face being thinner than the releasable coating layer on said rear face; and a layer of pressure sensitive adhesive adhered to said layer of release coating material on said front face.

7. A device as defined in claim 6 wherein said carrier sheet is rolled up upon itself with said adhesive layer contacting the layer of release coating on said rear face of the sheet.

8. A device as defined in claim 7 wherein said sheet is formed of a material selected from the group consisting of paper, vinyl and/or plastic.

9. A device as defined in claim 8 wherein said release coatings are formed of silicone.

* * * * *